United States Patent
Chen et al.

(10) Patent No.: US 9,281,273 B1
(45) Date of Patent: Mar. 8, 2016

(54) DESIGNED-BASED INTERCONNECT STRUCTURE IN SEMICONDUCTOR STRUCTURE

(71) Applicant: Taiwan Semiconductor Manufacturing Co., Ltd, Hsin-Chu (TW)

(72) Inventors: Chih-Liang Chen, Hsinchu (TW);
Chih-Ming Lai, Hsinchu (TW);
Yung-Sung Yen, New Taipei (TW);
Kam-Tou Sio, Zhubei (TW);
Tsong-Hua Ou, Taipei (TW);
Chun-Kuang Chen, Guanxi Township (TW); Ru-Gun Liu, Zhubei (TW);
Shu-Hui Sung, Baoshan Township (TW); Charles Chew-Yuen Young, Cupertino, CA (US)

(73) Assignee: Taiwan Semiconductor Manufacturing Co., LTD., Hsin-Chu (TW)

( * ) Notice: Subject to any disclaimer, the term of this patent is extended or adjusted under 35 U.S.C. 154(b) by 0 days.

(21) Appl. No.: 14/476,349

(22) Filed: Sep. 3, 2014

(51) Int. Cl.
*H01L 27/118* (2006.01)
*H01L 23/528* (2006.01)
*H01L 23/522* (2006.01)

(52) U.S. Cl.
CPC .......... *H01L 23/528* (2013.01); *H01L 23/5226* (2013.01); *H01L 27/11803* (2013.01)

(58) Field of Classification Search
CPC .............. H01L 23/528; H01L 23/5226; H01L 27/11803

USPC .................... 257/202, 206, 208, 211
See application file for complete search history.

(56) References Cited

U.S. PATENT DOCUMENTS

2013/0258759 A1* 10/2013 Liaw .................... G11C 11/412
365/154

* cited by examiner

*Primary Examiner* — Tan N Tran
(74) *Attorney, Agent, or Firm* — Birch, Stewart, Kolasch & Birch, LLP (57) ABSTRACT

Semiconductor structures are provided. The semiconductor structure includes a plurality of gate structures extending in a first direction formed over a substrate and a contact formed adjacent to the gate structures over the substrate. The semiconductor structure further includes a plurality of metal layers formed over the gate structures. In addition, some of the metal layers include metal lines extending in the first direction, and some of the metal layers include metal lines extending in a second direction substantially perpendicular to the first direction. Furthermore, the gate structures follow the following equation:

$$\frac{0.2P_{gate\,min} + 0.35L_{gate\,min} + 0.3H_{gate\,min} - 20}{0.2L_{gate\,min} + 0.8H_{gate\,min} - 5} \times$$

$$\frac{0.3L_{gate\,min} + 0.3H_{gate\,min} + 5}{38} \le 0.32$$

$P_{gate\,min}$ is the minimum value among gate pitches of the gate structures. $L_{gate\,min}$ is the minimum value among gate lengths of the gate structures. $H_{gate\,min}$ is the minimum value among gate heights of the gate structures.

20 Claims, 7 Drawing Sheets

DESIGNED-BASED INTERCONNECT STRUCTURE IN SEMICONDUCTOR STRUCTURE

BACKGROUND

The semiconductor integrated circuit (IC) industry has experienced rapid growth. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer-technology process nodes in pursuit of higher device density, higher performance, and lower costs, challenges from both fabrication and design have resulted in the development of multilayer (or three dimensional) integrated devices. The multilayer devices may include a plurality of dielectric layers each including one or more conductive layers which are aligned and connected with other conductive layers. However, as the scaling-down continues, forming and aligning conductive layers has proved difficult. Accordingly, although existing multilayer devices and methods of fabricating multilayer devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures are provided in accordance with some embodiments of the disclosure. The semiconductor structures may include interconnection structures. The interconnection structures may include metal lines formed over gate structures, and the metal lines may be designed in accordance with the sizes and/or the layout of the gate structures, such that the interconnect structures can have better performance.

Figure 1A:
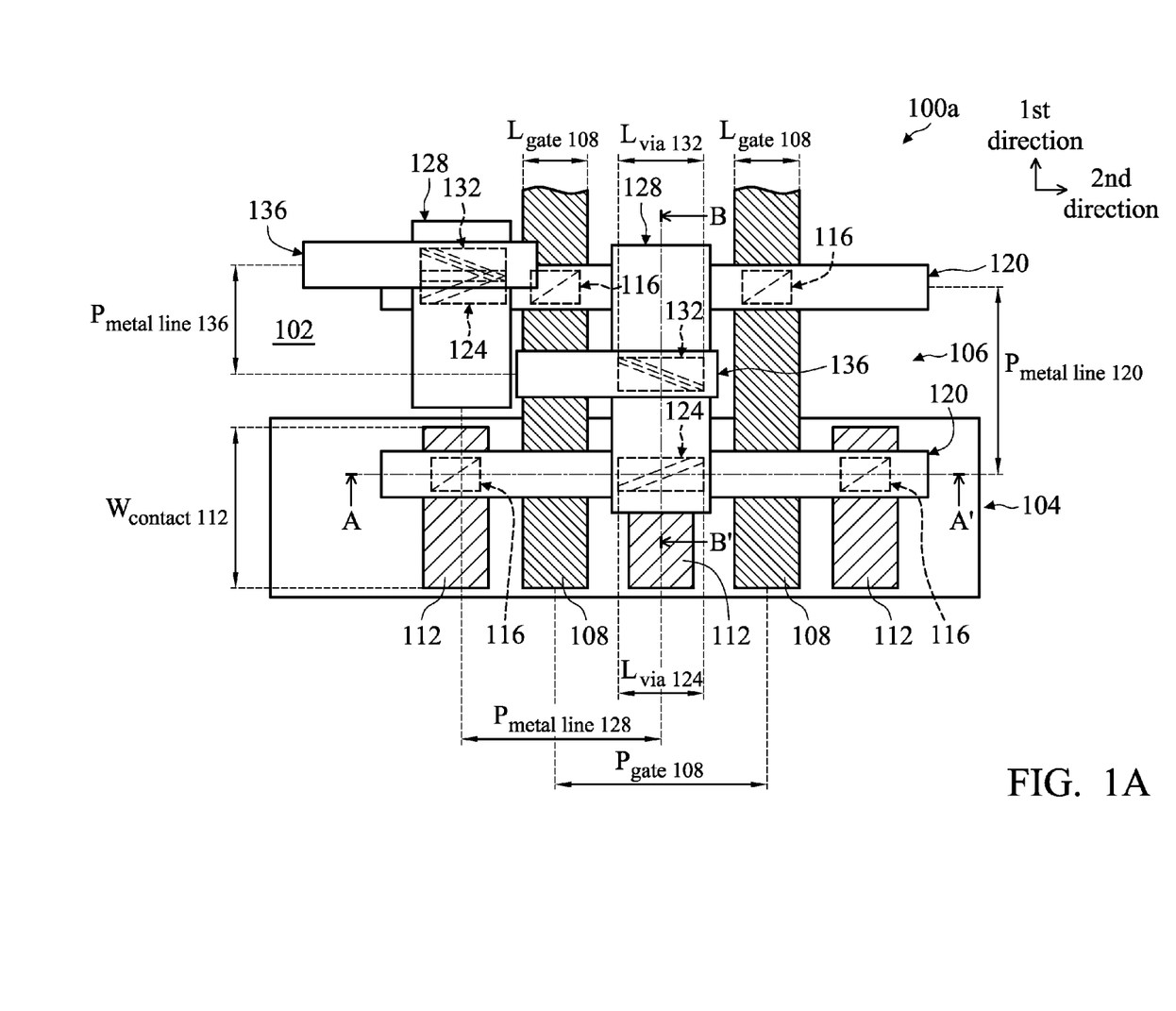
FIG. 1A is a top-view representation of a semiconductor structure in accordance with some embodiments.
Figure 1B:
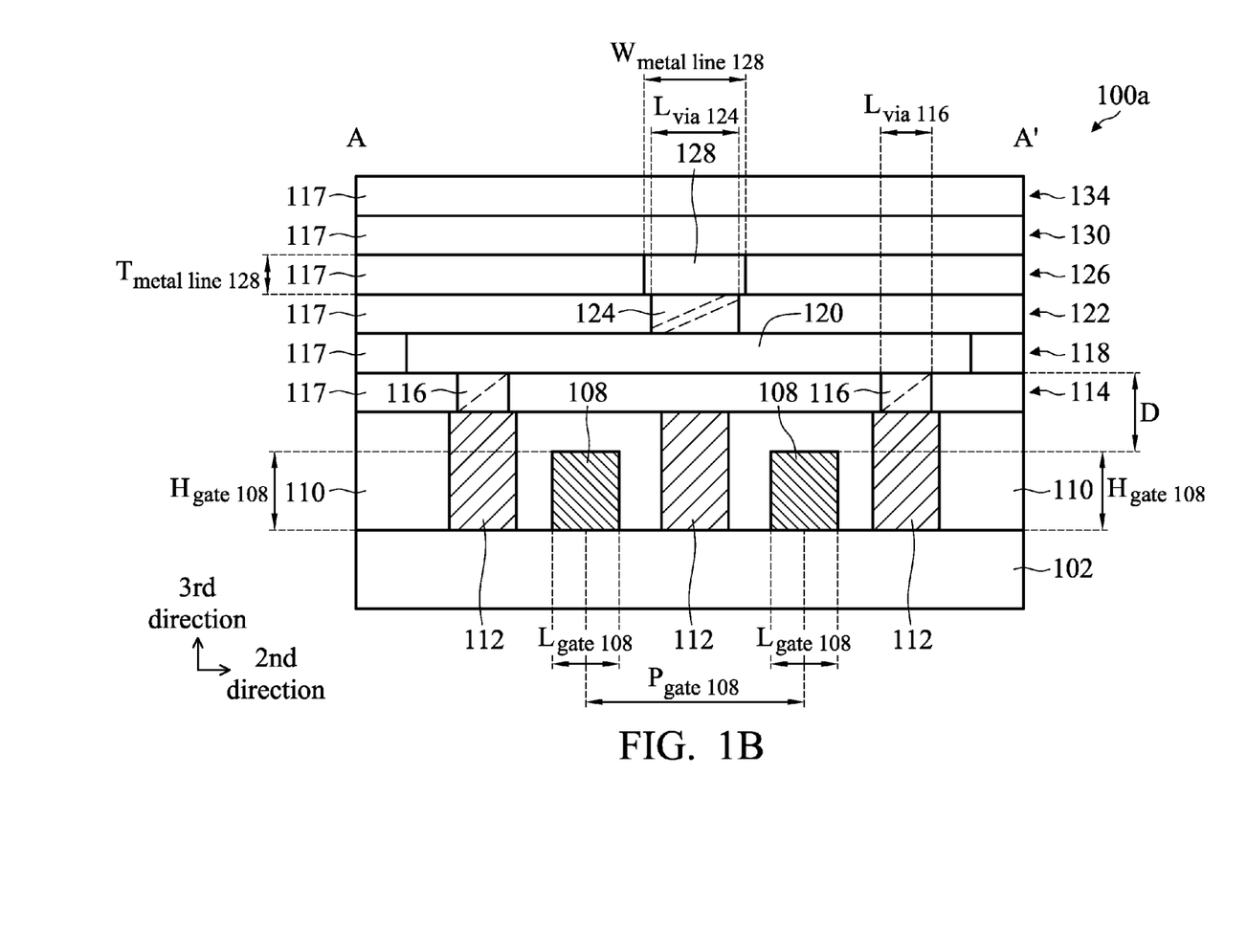
FIG. 1B is a cross-sectional representation of the semiconductor structure along lines A-A' shown in FIG. 1A in accordance with some embodiments.
Figure 1C:
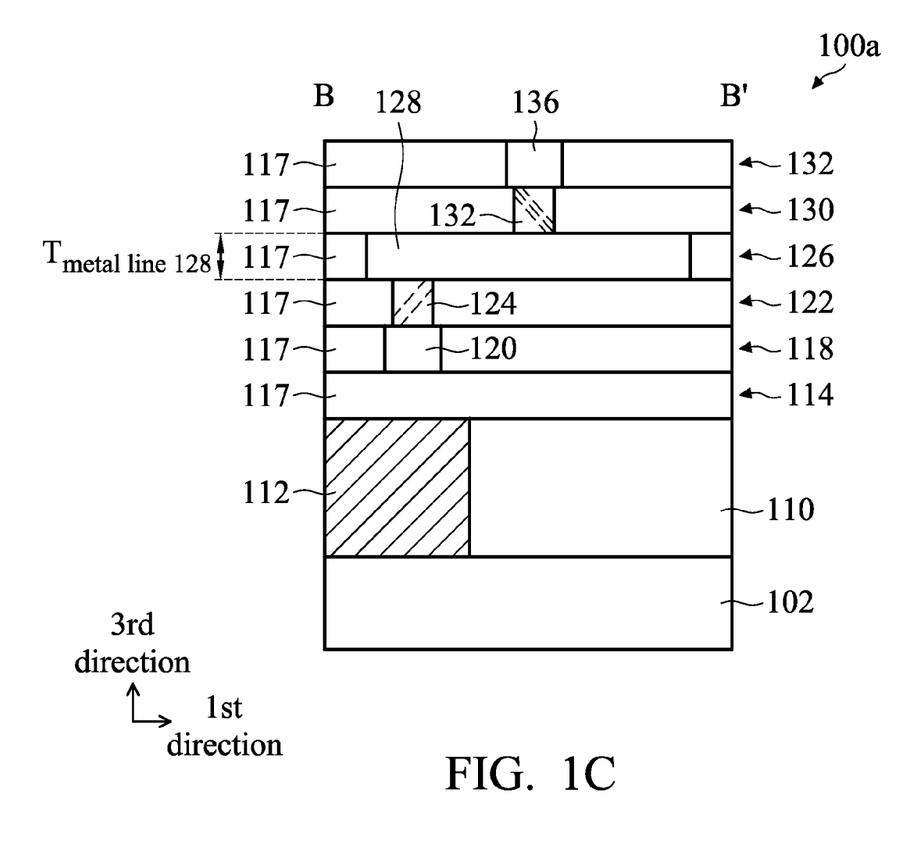
FIG. 1C is a cross-sectional representation of the semiconductor structure along lines B-B' shown in FIG. 1A in accordance with some embodiments.

FIG. 1A is a top-view representation of a semiconductor structure 100a in accordance with some embodiments. FIG. 1B is a cross-sectional representation of semiconductor structure 100a along lines A-A' shown in FIG. 1A in accordance with some embodiments. FIG. 1C is a cross-sectional representation of semiconductor structure 100a along lines B-B' shown in FIG. 1A in accordance with some embodiments.

As shown in FIGS. 1A to 1C, semiconductor structure 100a includes a substrate 102 in accordance with some embodiments. In addition, a diffusion region 104 and an isolation structure 106 are formed in substrate 102. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenide, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In some embodiments, diffusion region 104 is an oxide diffusion region formed in substrate 102. Diffusion region 104 may be a P-type doping region or an N-type doping region. In some embodiments, diffusion region 104 further includes source and drain regions. Isolation structure 106 may be used to separate diffusion region 104 from other diffusion regions (not shown). In some embodiments, isolation structure 106 is a shallow trench isolation (STI) structure.

Gate structures 108 are formed over substrate 102, as shown in FIG. 1A to 1C in accordance with some embodiments. Gate structures 108 are formed extending in a first direction substantially parallel to substrate 102. As shown in FIGS. 1A and 1B, each gate structure 108 has its gate length $L_{gate\ 108}$ and its gate height $H_{gate\ 108}$, and it should be noted that gate lengths $L_{gate\ 108}$ and gate heights $H_{gate\ 108}$ of different gate structures 108 may be the same or different.

Gate length $L_{gate\ 108}$ is defined as the channel length of one gate structure 108. For example, gate length $L_{gate\ 108}$ of one gate structure 108 is defined as the distance between two sidewalls of the gate structure 108 in a second direction substantially perpendicular to the first direction. As shown in FIG. 1B, the second direction is also substantially parallel to substrate 102.

Gate height $H_{gate\ 108}$ is defined as the height of one gate structure 108 measured in a third direction substantially perpendicular to the substrate 102. As shown in FIGS. 1A and 1B, the first direction and the second direction are both substantially parallel to the substrate 102 but are substantially perpendicular to each other, and the third direction is substantially perpendicular to both the first direction and the second direction.

In addition, gate structures 108 has a gate pitch $P_{gate\ 108}$, as shown in FIGS. 1A and 1B. Gate pitch $P_{gate\ 108}$ is defined as the distance between the center of one gate structure 108 to the center of another gate structure 108. As shown in FIG. 1B, gate pitch $P_{gate\ 108}$ may be measured along the second direction.

Gate structures 108 may include gate dielectric layers and gate electrodes. In some embodiments, gate dielectric layers are made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina (HfO$_2$—Al$_2$O$_3$) alloy, and other applicable dielectric materials.

Gate electrodes may be formed over gate dielectric layers. In some embodiments, gate electrodes are made of conductive materials, such as polysilicon, metal, metal alloy, and/or metal silicide. In some embodiments, gate electrodes are made of aluminum, tungsten, cobalt, tantalum, titanium aluminum, copper, or doped polysilicon.

Gate structures 108 may be formed by a procedure that includes deposition, photolithography patterning, and etching processes. The deposition processes may include chemical vapor deposition (CVD), physical vapor deposition (PVD), atomic layer deposition (ALD), high-density plasma CVD (HDPCVD), metal organic CVD (MOCVD), or plasma-enhanced CVD (PECVD). The photolithography patterning processes may include photoresist coating (e.g. spin-on coating), soft baking, mask aligning, exposure, post-exposure baking, developing the photoresist, rinsing, drying (e.g. hard baking), and/or other applicable processes. The etching processes may include dry etching, wet etching, and/or other etching methods (e.g. reactive ion etching).

Gate structures 108 are surrounded by an inter-layer dielectric (ILD) layer 110, as shown in FIG. 1B in accordance with some embodiments. In some embodiments, inter-layer dielectric layer 110 includes multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Inter-layer dielectric layer 110 may be formed by CVD, PVD, ALD, spin-on coating, and/or other applicable processes.

Contacts 112 are formed adjacent to gate structures 108 over substrate 102, as shown in FIG. 1A to 1C in accordance with some embodiments. More specifically, contacts 112 are formed in diffusion region 104 of substrate 102 in accordance with some embodiments. As shown in FIG. 1A, each contact 112 has a contact width $W_{contact\ 112}$. Contact width $W_{contact\ 112}$ is defined as the length of one contact 112 in diffusion region 104 along the first direction. It should be noted that a contact may include a number of portions aligned in the first direction in a diffusion region, and its contact width is defined as the sum of all portions of the contact.

In some embodiments, contacts 112 are made of conductive material such as aluminum, copper, tungsten, titanium, tantulum, titanium nitride, tantalum nitride, nickel silicide, cobalt silicide, TaC, TaSiN, TaCN, TiAl, TiAlN, or other applicable conductive materials. Contacts 112 may be formed by sputtering, electroless plating, CVD, PVD, or ALD.

After gate structures 108 and contacts 112 are formed over substrate 102, an interconnect structure is formed to electrically connect with gate structures 108 and contacts 112. As shown in FIG. 1A, the interconnect structure includes first level vias 116, first level metal lines 120, second level vias 124, second level metal lines 128, third level vias 132, and third level metal lines 136 in accordance with some embodiments. In addition, first level vias 116, first level metal lines 120, second level vias 124, second level metal lines 128, third level vias 132, and third level metal lines 136 are formed in inter-metal dielectric (IMD) layer 117.

More specifically, a first level via layer 114 is formed over gate structures 108, as shown in FIG. 1A to 1C in accordance with some embodiments. First level via layer 114 includes first level vias 116 formed in inter-metal dielectric layer 117 in accordance with some embodiments. In addition, each first level via 116 has a via length $L_{via\ 116}$, which is measured along the second direction.

In some embodiments, first level vias 116 are made of a highly-conductive metal, low-resistive metal, elemental metal, transition metal, or the like. Examples of conductive materials used to form first level vias 116 may include, but are not limited to, copper (Cu), aluminum (Al), tungsten (W), titanium (Ti), gold (Au), cobalt (Co), and tantalum (Ta).

In some embodiments, inter-metal dielectric layer 117 includes multilayers made of multiple dielectric materials, such as a low dielectric constant or an extreme low dielectric constant (ELK) material. Examples of the dielectric materials may include, but are not limited to, oxide, SiO$_2$, borophosphosilicate glass (BPSG), tetraethyl orthosilicate (TEOS), spin on glass (SOG), undoped silicate glass (USG), fluorinated silicate glass (FSG), high-density plasma (HDP) oxide, or plasma-enhanced TEOS (PETEOS).

After first level via layer 114 is formed, a first level metal layer 118 is formed over first level via layer 114, as shown in FIG. 1B in accordance with some embodiments. First level metal layer 118 includes first level metal lines 120 formed in inter-metal dielectric layer 117 in accordance with some embodiments. As shown in FIG. 1B, one of contacts 112, which is formed adjacent to gate structures 108 over substrate 102, is in direct contact with one of first level vias 116, and the first level via 116 is in direct contact with one of first level metal lines 120. In addition, one of first level metal line 120 is formed over one of gate structures 108 and is separated from the gate structure 108 by a distance D measured in the third direction. In some embodiments, distance D is larger than or equal to 0.25 times gate length $L_{gate\ 108}$ of the gate structure 108.

In addition, a metal line pitch $P_{metal\ line\ 120}$ of first level metal lines 120 is defined as the distance between the center of one first level metal line 120 to the center of another first level metal line 120, as shown in FIG. 1A.

In some embodiments, first level metal lines 120 are made of a highly-conductive metal, low-resistive metal, elemental metal, transition metal, or the like. Examples of conductive materials used to form first level metal lines 120 may include, but are not limited to, copper (Cu), aluminum (Al), tungsten (W), titanium (Ti), gold (Au), cobalt (Co), or tantalum (Ta).

After first level metal layer 118 is formed, a second level via layer 122 is formed over first level metal layer 118, and a second level metal layer 126 is formed over second level via layer 122, as shown in FIG. 1A to 1C in accordance with some embodiments. In some embodiments, second level via layer 122 includes second level vias 124 formed in inter-metal dielectric layer 117, and second level metal later 126 includes second level metal lines 128 formed in inter-metal dielectric layer 117.

Similarly, each second level via 124 has a via length $L_{via\ 124}$ measured along the second direction. In addition, second level metal lines 128 have a metal line pitch $P_{metal\ line\ 128}$ defined as the distance between the central of one second level metal line 128 to the central of another second level metal line 128. Materials used to form second level vias 124 and second level metal lines 128 may be the same as, or similar to, those used to form first level vias 116 and first level metal lines 120 and are not repeated herein.

After second level metal layer 126 is formed, a third level via layer 130 is formed over second level metal layer 126, and a third level metal layer 134 is formed over third level via layer 130, as shown in FIG. 1A to 1C in accordance with some embodiments. In some embodiments, third level via layer 130 includes third level vias 132 formed in inter-metal dielectric layer 117, and third level metal layer 134 includes third level metal lines 136 formed in inter-metal dielectric layer 117.

Similarly, each third level via 132 has a via lengths $L_{via\ 132}$ measured along the second direction. In addition, third level metal lines 136 have a metal line pitch $P_{metal\ line\ 136}$ defined as the distance between the central of one third level metal line 136 to the central of another third level metal line 136. Materials used to form third level vias 132 and third level metal lines 136 may be the same as, or similar to, those used to form first level vias 116 and first level metal lines 120 and are not repeated herein.

The layout and sizes of the structures in semiconductor structure 100a are designed to perform better and to reduce the manufacturing cost in accordance with some embodiments. In some embodiments, a contact in semiconductor structure 100a are designed to follow the following equation (1):

$$W_{contact} \geq 1.4 L_{gate\ min} \quad (1)$$

In equation (1), $L_{gate\ min}$ is the minimum value among gate lengths of the gate structures in a semiconductor structure. In some embodiments, all gate structures have the same gate length, and $L_{gate\ min}$ is referred to the gate length of any one of the gate structures. In some other embodiments, the gate structures have various gate lengths, and $L_{gate\ min}$ refers to the smallest gate length among all of the gate lengths of the gate structures.

As shown in FIG. 1A, gate structures 108 in semiconductor 100a have the same gate length $L_{gate\ 108}$, and therefore gate length $L_{gate\ 108}$ can be seen as $L_{gate\ min}$ in equation (1). In some embodiments, at least one of contacts 112 has a contact width $W_{contact\ 112}$ greater than or equal to (i.e. no less than) 1.4 times gate length $L_{gate\ 108}$ (i.e. $L_{gate\ min}$). In some embodiments, contact width $W_{contact\ 112}$ is equal to 3 times gate length $L_{gate\ 108}$ and therefore is greater than 1.4 times gate length $L_{gate\ 108}$.

It is found that if the contact width of a contact is relatively too small, the resistance of the contact may be too great. In some embodiments, one contact 112 in semiconductor structure 100a is designed to follow the following equation (1.1):

$$30 L_{gate\ min} > W_{contact} \geq 1.4 L_{gate\ min} \quad (1.1)$$

In some embodiments, gate structures 108 in semiconductor structure 100a are designed to follow the following equation (2):

$$\frac{0.2 P_{gate\ min} + 0.35 L_{gate\ min} + 0.3 H_{gate\ min} - 20}{0.2 L_{gate\ min} + 0.8 H_{gate\ min} - 5} \times \quad (2)$$

$$\frac{0.3 L_{gate\ min} + 0.3 H_{gate\ min} + 5}{38} \leq 0.32$$

In equation (2), $P_{gate\ min}$ is the minimum value among gate pitches of the gate structures. $L_{gate\ min}$ is the minimum value among gate lengths of the gate structures. $H_{gate\ min}$ is the minimum value among gate heights of the gate structures. It is found that the value of $P_{gate\ min}$ will relate to the capacitance in the second direction and the cell resistance of semiconductor structure 100a. In addition, the value of $L_{gate\ min}$ will relate to the capacitance in the second direction and the third direction. The value of $H_{gate\ min}$ will relate to the capacitance in the third direction. Therefore, when semiconductor structure 100a is designed to follow equation (2), the capacitance of semiconductor structure 100a may be improved.

As described previously, $L_{gate\ 108}$ can be seem as $L_{gate\ min}$ in equation (2). Similarly, gate pitch $P_{gate\ 108}$ of gate structures 108 can be seen as $P_{gate\ min}$. In addition, gate height $L_{gate\ 108}$ of gate structures 108 can be seen as $H_{gate\ min}$.

In some embodiments, gate structures 108 of semiconductor structure 100a follows the following equation:

$$\frac{0.2 P_{gate108} + 0.35 L_{gate108} + 0.3 H_{gate108} - 20}{0.2\ L_{gate108} + 0.8\ H_{gate108} - 5} \times$$

$$\frac{0.3 L_{gate108} + 0.3 H_{gate108} + 5}{38} = 0.036 \leq 0.32$$

In some embodiments, semiconductor structure 100a is designed to follow both equations (1) and (2). In some embodiments, gate structures 108 in semiconductor structure 100a are designed to follow the following equation (2.1):

$$-30 < \frac{0.2 P_{gate\ min} + 0.35 L_{gate\ min} + 0.3 H_{gate\ min} - 20}{0.2 L_{gate\ min} + 0.8 H_{gate\ min} - 5} \times \quad (2.1)$$

$$\frac{0.3 L_{gate\ min} + 0.3 H_{gate\ min} + 5}{38} \leq 0.32$$

In some embodiments, two metal layers in semiconductor structure 100a are designed to follow the following equation (3):

$$P_{metal\ line} \leq 0.76 P_{gate\ min} \quad (3)$$

In equation (3), $P_{gate\ min}$ is the minimum value among gate pitches of the gate structures. That is, the pitch of the metal lines in semiconductor structure 100a may be designed to be relatively small, such that the interconnect structure can have a higher routing density. Therefore, the resulting semiconductor structure 100a may have a better chip arrangement and appropriate route sizes.

In some embodiments, at least two metal line pitches in two metal layers of semiconductor structure 100a follow equation (3). In addition, the two metal line pitches are measured from two different metal layers. In some embodiments, $P_{metal\ line\ 120}$ of first level metal lines 120 is less than or equal to (i.e. no greater than) 0.76 times $P_{gate\ 108}$ of gate structure 108, and $P_{metal\ line\ 136}$ of third level metal lines 136 is less than or equal to (i.e. no greater than) 0.76 times $P_{gate\ 108}$ of gate structures 108, as shown in FIG. 1A in accordance with some embodiments. In some embodiments, $P_{metal\ line\ 120}$ of first level metal lines 120 is equal to 0.666 times $P_{gate\ 108}$ of gate structure 108 and therefore less than 0.76 times $P_{gate\ 108}$ of gate structures 108.

It should be noted that the metal lines in other metal layers may additionally or alternatively follow equation (3). That is, $P_{metal\ line}$ in equation (3) is not limited to the pitches of metal lines 120 and 136.

In some embodiments, the structures in semiconductor structure 100a are designed to follow the following equation (3.1):

$$0.1 P_{gate\ min} \leq P_{metal\ line} \leq 0.76 P_{gate\ min} \tag{3.1}$$

In some embodiments, the first metal layer having metal lines extending in the first direction in semiconductor structure 100a is designed to follow the following equation (4):

$$P_{1st\ metal\ line\ min} \geq 0.5 P_{gate\ min} + 0.55 L_{gate\ min} + 0.18 H_{gate\ min} \tag{4}$$

As described above, $P_{gate\ min}$ is the minimum value among gate pitches of the gate structures, and $L_{gate\ min}$ is the minimum value among gate lengths of the gate structures. $H_{gate\ min}$ is the minimum value among gate heights of the gate structures. In addition, a first metal layer is defined as the first metal layer having metal lines extending in a direction substantially parallel to the gate structures (e.g. in the first direction.) $P_{1st\ metal\ line\ min}$ is the minimum value among the pitches of the metal lines of the first metal layer. It is found that pitch $P_{1st\ metal\ line\ min}$ should be large enough to release the resistance of the semiconductor structure. In addition, when the first metal layer has a relatively low density, the lithography process for forming the structure may be less complicated, and the cost of forming the structure may be reduced.

More specifically, the first metal layer is the metal layer positioned closest to the gate structures among all the metal layers which include metal lines extending in the first direction. That is, the distance between the first metal layer and gate structures 108 (or substrate 102) is smaller than the distance between gate structures 108 (or substrate 102) and all other metal layers having metal lines extending in the first direction.

As shown in FIG. 1A, although second metal layer 126 is formed over first level metal layer 118, first level metal lines 118 do not extend in the first direction but in the second direction. Therefore, second level metal layer 126, which has second level metal lines 128 extending in the first direction, can be seen as the first metal layer in equation (4). In addition, pitch $P_{metal\ line\ 128}$ of second level metal lines 128 can be seen as $P_{1st\ metal\ line\ min}$ in equation (4). Therefore, $P_{metal\ line\ 128}$ of second level metal lines 128 is greater than or equal to (i.e. no less than) the sum of 0.5 times $P_{gate\ 108}$ of gate structures 108 and 0.55 times $L_{gate\ 108}$ of gate structures 108 and 0.18 times $H_{gate\ 108}$ of gate structures 108 in accordance with some embodiments.

In some embodiments, $P_{metal\ line\ 128}$ of second level metal lines 128 is equal to the sum of 0.62 times $P_{gate\ 108}$ of gate structures 108 and 0.65 times $L_{gate\ 108}$ of gate structures 108 and 0.23 times $H_{gate\ 108}$ of gate structures 108. In some embodiments, semiconductor structure 100a is designed to follow both equations (3) and (4). In some embodiments, the structures in semiconductor structure 100a are designed to follow the following equation (4.1):

$$5P_{gate\ min} + 5.5 L_{gate\ min} + 1.8 H_{gate\ min} \geq P_{1st\ metal\ line\ min} \geq 5 P_{gate\ min} + 0.55 L_{gate\ min} + 0.18 H_{gate\ min} \tag{4.1}$$

In some embodiments, one of the metal lines in the first metal layer in semiconductor structure 100a is designed to follow the following equation (5):

$$T_{1st\ metal\ line} \geq 0.6 P_{gate\ min} + 0.45 L_{gate\ min} + 0.15 H_{gate\ min} \tag{5}$$

As described previously, $P_{gate\ min}$ is the minimum value among gate pitches of the gate structures, and $L_{gate\ min}$ is the minimum value among gate lengths of the gate structures. $H_{gate\ min}$ is the minimum value among gate heights of the gate structures. The first metal layer is defined as the first metal layer having metal lines extending in the first direction, and the metal lines in the first metal layer are called first metal lines. In addition, thickness $T_{1st\ metal\ line}$ is the thickness of one of the first metal lines in the first metal layer. It is found that when the thickness of the first metal line is relatively thick, the resistance will be reduced.

In some embodiments, second level metal line 128 can be seen as the first metal line, and thickness $T_{metal\ line\ 128}$ of second level metal line 128 can be seen as $T_{1st\ metal\ line}$ in equation (5). In some embodiments, thickness $T_{metal\ line\ 128}$ of second level metal line 128 is greater than or equal to (i.e. no less than) the sum of 0.6 times $P_{gate\ 108}$ of gate structures 108 and 0.45 times $L_{gate\ 108}$ of gate structures 108 and 0.15 times H gate structures 108. It should be gate 108 of noted that, as shown in FIG. 1A, the first metal layer (e.g. second level metal layer 126) may include more than one metal line, and $T_{1st\ metal\ line}$ in equation (5) may be chosen from any one of the metal lines in the first metal layer.

In some embodiments, thickness $T_{metal\ line\ 128}$ of second level metal line 128 is equal to the sum of 0.64 times $P_{gate\ 108}$ of gate structures 108 and 0.65 times $L_{gate\ 108}$ of gate structures 108 and 0.23 times $H_{gate\ 108}$ of gate structures 108. In some embodiments, the first metal line in semiconductor structure 100a are designed to follow the following equation (5.1):

$$6P_{gate\ min} + 4.5 L_{gate\ min} + 1.5 H_{gate\ min} \geq T_{1st\ metal\ line} \geq 6 P_{gate\ min} + 0.45 L_{gate\ min} + 0.15 H_{gate\ min} \tag{5.1}$$

In some embodiments, one of the first metal lines in the first metal layer in semiconductor structure 100a is designed to follow the following equation (6):

$$W_{1st\ metal\ line} \geq 0.38 P_{gate\ min} + 0.23 L_{gate\ min} + 0.13 H_{gate\ min} \tag{6}$$

As described previously, $P_{gate\ min}$ is the minimum value among gate pitches of the gate structures, and $L_{gate\ min}$ is the minimum value among gate lengths of the gate structures. $H_{gate\ min}$ is the minimum value among gate heights of the gate structures. The first metal layer is defined as the first metal layer having metal lines extending in the first direction. In addition, $W_{1st\ metal\ line}$ is the width of the first metal line in the first metal layer. Since the first metal line in the first metal layer is substantially parallel to the gate structures, the width of the metal line is measured alone the second direction substantially perpendicular to the first direction. It is found that when the width of the first metal line in the first metal layer is relatively wide, the resistance can be reduced. However, the width of the first metal line should not be too wide, or the risk of circuit short may increase.

In some embodiments, width $W_{metal\ line\ 128}$ of second level metal line 128 can be seen as $W_{1st\ metal\ line}$ in equation (6), and width $W_{metal\ line\ 128}$ of second level metal line 128 is greater than or equal to (i.e. no less than) the sum of 0.38 times $P_{gate\ 108}$ of gate structures 108 and 0.23 times $L_{gate\ 108}$ of gate structures 108 and 0.13 times $H_{gate\ 108}$ of gate structures 108. In some embodiments, at least one of the metal lines in the first metal layer follows equation (6). In some embodiments, all metal lines in the first metal layer follow equation (6).

In some embodiments, width $W_{metal\ line\ 128}$ of second level metal line 128 is equal to the sum of 0.43 times $P_{gate\ 108}$ of gate structures 108 and 0.35 times $L_{gate\ 108}$ of gate structures 108 and 0.15 times $H_{gate\ 108}$ of gate structures 108. In some embodiments, the first metal lines in semiconductor structure 100a are designed to follow the following equation (6.1):

$$3.8P_{gate\ min}+2.3L_{gate\ min}+1.3H_{gate\ min} \geq W_{1st\ metal\ line} \geq 0.38P_{gate\ min}+0.23L_{gate\ min}+0.13H_{gate\ min} \quad (6.1)$$

In some embodiments, a via connected to one first metal line in semiconductor structure 100a is designed to follow the following equation (7):

$$L_{via} \geq 0.26P_{gate\ min}+0.11L_{gate\ min}+0.12H_{gate\ min} \quad (7)$$

As described previously, $P_{gate\ min}$ is the minimum value among gate pitches of the gate structures, and $L_{gate\ min}$ is the minimum value among gate lengths of the gate structures. $H_{gate\ min}$ is the minimum value among gate heights of the gate structures. The first metal layer is defined as the first metal layer having metal lines extending in the first direction. $L_{via}$ is the length of a via connecting to the first metal line of the first metal layer. It is found that when the length of the via connecting to the first metal line in the first metal layer is relatively wide, the resistance can be reduced.

In some embodiments, length $L_{via\ 124}$ of second level via 124 can be seen as $L_{via}$ in equation (7), as shown in FIG. 1A. As shown in FIG. 1A, $L_{via}$ is measured along the second direction. In some embodiments, length $L_{via\ 124}$ of second level via 124 is greater than or equal to (i.e. no less than) the sum of 0.26 times $P_{gate\ 108}$ of gate structures 108 and 0.11 times $L_{gate\ 108}$ of gate structures 108 and 0.12 times $H_{gate\ 108}$ of gate structures 108.

It should be noted that $L_{via}$ in equation (7) may refer to the length of any via formed below or above any one of the first metal lines in the first metal layer. Therefore, in some embodiments, $L_{via}$ in equation (7) can be referred to length $L_{via\ 132}$ of third level via 132. In some embodiments, at least one of the vias connecting to the first metal line follows equation (7). In some embodiments, all vias connecting to the first metal lines follow equation (7). In some embodiments, length $L_{via\ 124}$ of second level via 124 is equal to the sum of 0.43 times $P_{gate\ 108}$ of gate structures 108 and 0.35 times $L_{gate\ 108}$ of gate structures 108 and 0.15 times $H_{gate\ 108}$ of gate structures 108. In some embodiments, a via connecting one of the first metal lines in semiconductor structure 100a is designed to follow the following equation (7.1):

$$2.6P_{gate\ min}+1.1L_{gate\ min}+1.2H_{gate\ min} \geq L_{via} \geq 0.26P_{gate\ min}+0.11L_{gate\ min}+0.12H_{gate\ min} \quad (7.1)$$

In some embodiments, semiconductor structure 100a follows at least one equation in equations (1) to (7). In some embodiments, semiconductor structure 100a follows equations (1) to (4) and one of equations (5) to (7). In some embodiments, semiconductor structure 100a follows all equations (1) to (7) and results in 4.8% of the performance gain.

It should be noted that, although FIGS. 1A to 1C described above show two metal lines formed in each metal layer, the metal layer may actually include any number of metal lines. In addition, semiconductor structure 100a may further include various conductive features in various dielectric layers.

In addition, the conductive features described above, such as metal lines and vias, may further include a liner and/or a barrier layer. The liner (not shown) may be either tetraethylorthosilicate (TEOS) or silicon nitride, although any other applicable dielectric may alternatively be used. The liner may be formed using a plasma enhanced chemical vapor deposition (PECVD) process, although other applicable processes, such as physical vapor deposition or a thermal process, may alternatively be used.

The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

Figure 2A:
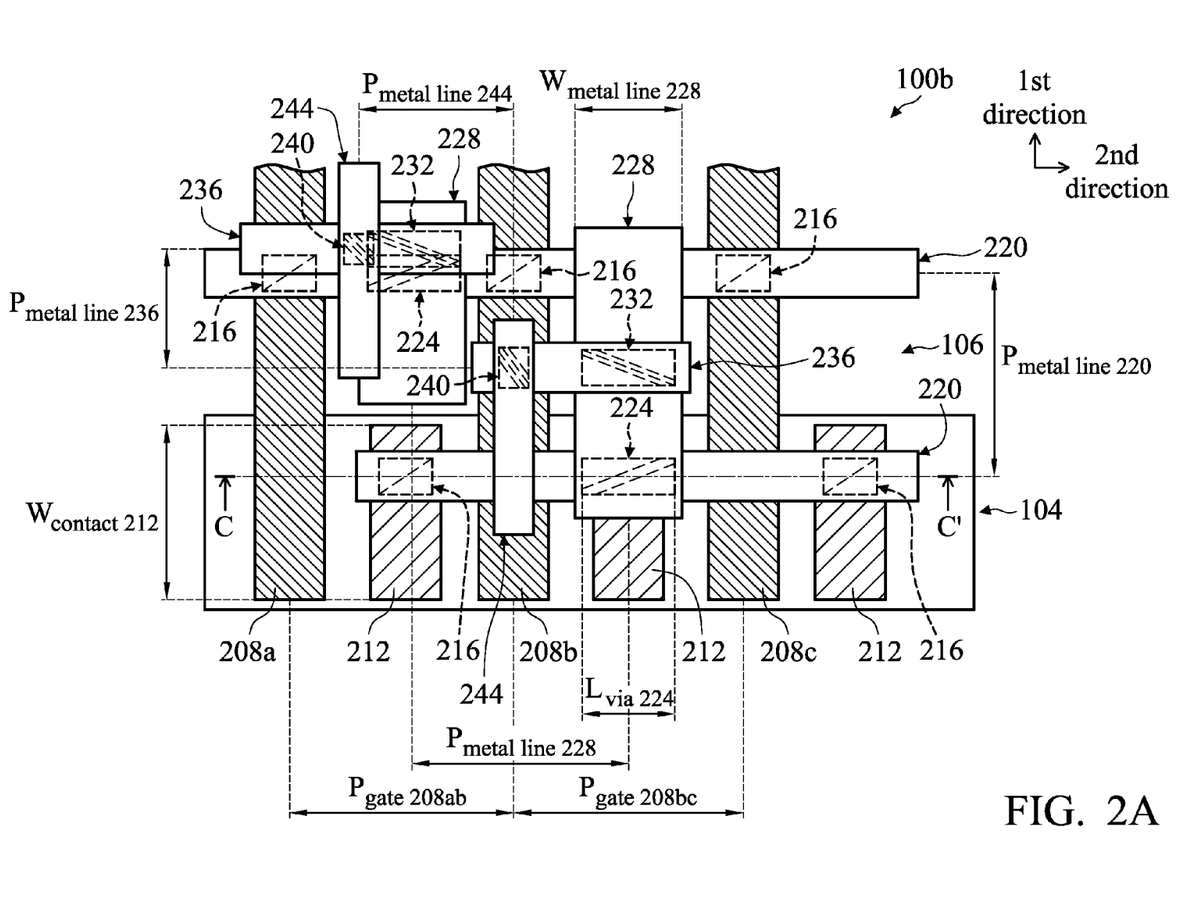
FIG. 2A is a top-view representation of a semiconductor structure in accordance with some embodiments.
Figure 2B:
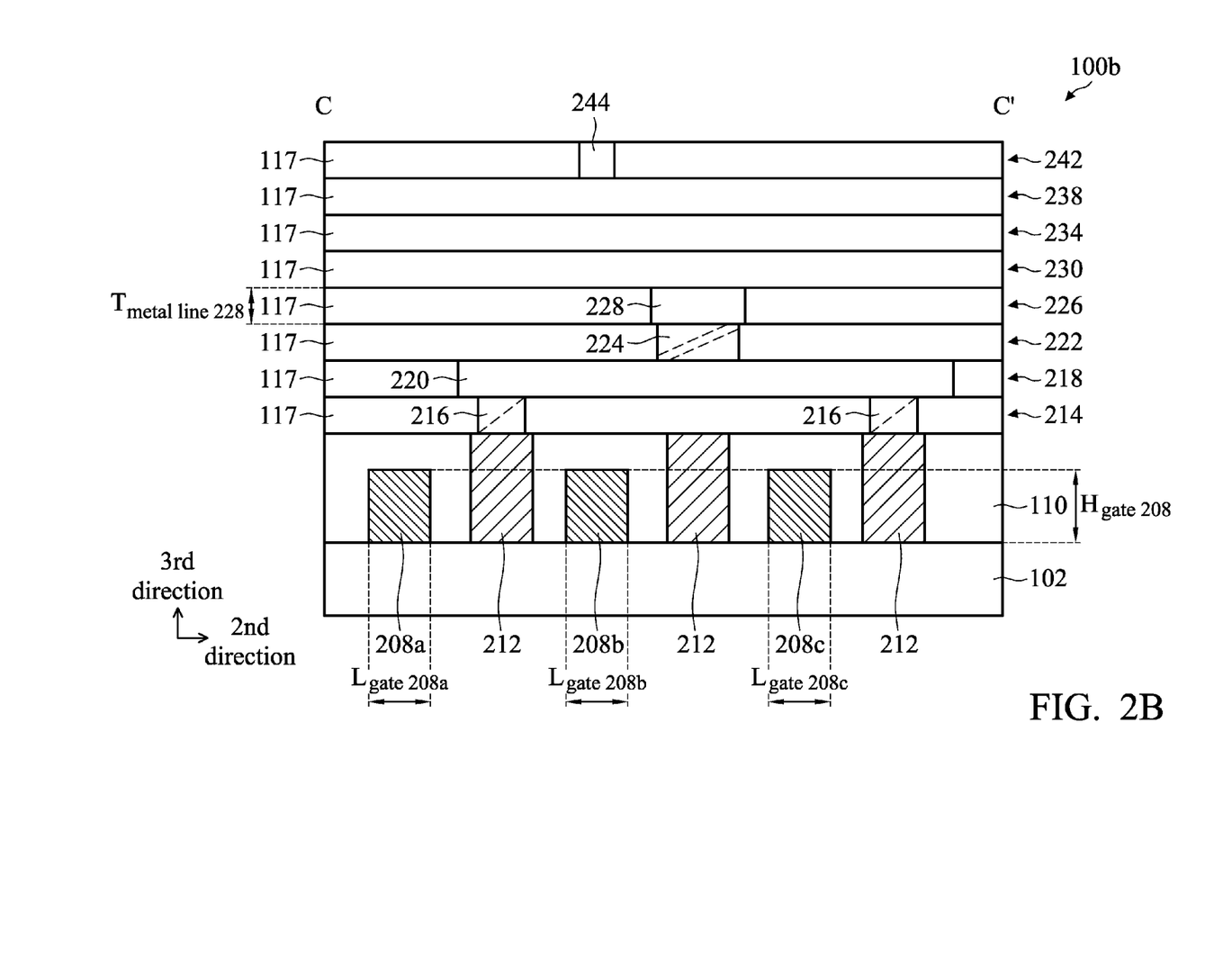
FIG. 2B is a cross-sectional representation of the semiconductor structure along lines C-C' shown in FIG. 2A in accordance with some embodiments.

FIG. 2A is a top-view representation of a semiconductor structure 100b in accordance with some embodiments. FIG. 2B is a cross-sectional representation of semiconductor structure 100b along lines C-C' shown in FIG. 2A in accordance with some embodiments.

Similar to semiconductor structure 100a, semiconductor structure 100b also includes substrate 102, diffusion region 104, and isolation structure 106. In addition, gate structures 208a, 208b, and 208c are formed in inter-level dielectric layer 110 over substrate 102 in accordance with some embodiments. As shown in FIG. 2B, gate structures 208a, 208b, and 208c respectively have various gate lengths $L_{gate\ 208a}$, $L_{gate\ 208b}$, and $L_{gate\ 208c}$, and gate length $L_{gate\ 208c}$ is the smallest among all gate structures 208a to 208c in accordance with some embodiments. Therefore, the $L_{gate\ min}$ in diffusion region 104 in semiconductor structure 100b refers to gate length $L_{gate\ 208c}$ of gate structure 208c.

In addition, gate structures 208a, 208b, and 208c have the same height $H_{gate}$, and therefore $H_{gate\ min}$ refers to $H_{gate}$ of any one of gate structures 208a, 208b, and 208c. Furthermore, gate structures 208a and gate 208b have a gate pitch $P_{gate\ 208ab}$, and gate structures 208b and 208c have a gate pitch $P_{gate\ 208bc}$, which is larger than gate pitch $P_{gate\ 208ab}$, as shown in FIG. 2A in accordance with some embodiments. Therefore, $P_{gate\ min}$ in diffusion region 104 in semiconductor structure 100b refers to gate pitch $P_{gate\ 208ab}$.

Materials and methods used to form gate structures 208a, 208b, and 208c may be similar to, or the same as, gate structures 108 shown in FIGS. 1A to 1C, and therefore the details of forming gate structures 208a, 208b, and 208c are not repeated herein.

Contacts 212, similar to contacts 112, are formed adjacent to gate structures 208a, 208b, and 208c over substrate 102, as shown in FIGS. 2A and 2B in accordance with some embodiments. As shown in FIG. 2A, each contact 212 has a contact width $W_{contact\ 212}$ in accordance with some embodiments.

After gate structures 208a, 208b, and 208c and contacts 212 are formed over substrate 102, an interconnect structure is formed to electrically connect with gate structures 208a,

208b, and 208c and contacts 212. As shown in FIG. 2A, the interconnect structure includes first level vias 216, first level metal lines 220, second level vias 224, second level metal lines 228, third level vias 232, third level metal lines 236, fourth level vias 240, and fourth level metal lines 244 formed in inter-metal dielectric layer 117 in accordance with some embodiments.

Similar to the metal lines and vias shown in FIG. 1A and described above, a first level via layer 214 including first level vias 216 formed over gate structures 208a to 208c, and a first level metal layer 218 including first level metal lines 220 is formed over first level via layer 214, as shown in FIG. 2A in accordance with some embodiments. In addition, a second level via layer 222 including second level vias 224 is formed over first level metal layer 218, and a second level metal layer 226 including second level metal lines 228 is formed over second level via layer 222.

Next, a third level via layer 230 including third level vias 232 is formed over second level metal layer 226, and a third level metal layer 234 including third level metal lines 236 is formed over third level via layer 230. Afterwards, a forth level via layer 238 including fourth level vias 240 is formed over third level metal layer 234, and a fourth level metal layer 242 including fourth level metal lines 244 is formed over fourth level via layer 234. Materials and method used to form the metal lines and via shown in FIG. 2A may be similar to, or the same as, those used to form the metal lines and vias shown in FIGS. 1A to 1C, and therefore the details are not repeated herein.

The layout and sizes of the structures in semiconductor structure 100b are designed to follow at least one of equations (1) to (7) described previously, such that semiconductor structure 100b can have a better performance.

In some embodiments, contact width $W_{contact\ 212}$ of one of contacts 212 in semiconductor structure 100b is greater than 1.4 times gate length $L_{gate\ 208c}$ of gate structure 208c (i.e. $L_{gate\ min}$). That is, contact width $W_{contact\ 212}$ in diffusion region 104 in semiconductor structure 100b is designed to follow equation (1) described previously.

The gate structures 208a to 208c in semiconductor structure 100b may be designed to follow equation (2) described previously. In some embodiments, gate structures 208a, 208b, and 208c are designed to follow the following equation:

$$\frac{0.2P_{gate208ab} + 0.35L_{gate208c} + 0.3H_{gate} - 20}{0.2L_{gate208c} + 0.8H_{gate} - 5} \times \frac{0.3L_{gate208c} + 0.3H_{gate} + 5}{38} \leq 0.32$$

As shown in FIG. 2A, first level metal lines 220, second level metal lines 228, third level metal lines 236, and fourth level metal lines 244 respectively have metal line pitches $P_{metal\ line\ 220}$, $P_{metal\ line\ 228}$, $P_{metal\ line\ 236}$, and $P_{metal\ line\ 244}$. The metal lines in semiconductor structure 100b may be designed to follow equation (3) described previously. In some embodiments, at least two of the metal line pitches in semiconductor structure 100b are smaller than or equal to 0.76 times $P_{gate\ 208ab}$ (i.e. $P_{gate\ min}$). For example, $P_{metal\ line\ 236}$ and $P_{metal\ line\ 244}$ are both smaller than or equal to 0.76 times $P_{gate\ 208ab}$.

As described previously, the first metal layer is defined as the first metal layer having metal lines extending in the direction substantially parallel to the gate structures (e.g. in the first direction.) As shown in FIG. 2A, the first metal layer in semiconductor structure 100b may be referred to second level metal layer 226. Accordingly, $P_{1st\ metal\ line\ min}$ in equation (4) refers to $P_{metal\ line\ 228}$, and $P_{metal\ line\ 228}$ is greater than or equal to the sum of 0.5 times $P_{gate\ 208ab}$ (i.e. $P_{gate\ min}$) and 0.55 times $L_{gate\ 208c}$ of gate structure 208c (i.e. $L_{gate\ min}$) and 0.18 times $H_{gate}$ of any one of gate structures 208a to 208c (i.e. $H_{gate\ min}$) in accordance with some embodiments. That is, second level metal layer 226, which can be seen as the first metal layer in semiconductor structure 100b, may be designed to follow equation (4) described previously.

In some embodiments, as shown in FIG. 2B, metal layers in semiconductor structure 100b includes a first metal layer including metal lines extending in the first direction (e.g. second level metal layer 226), a first type metal layers including metal lines extending in the first direction (e.g. fourth level metal layer 242), and a second type metal layers including metal lines extending in the second direction (e.g. first level metal layer 218 and third level metal layer 234). In addition, the first type metal layers is formed over the first metal layer, such that the first metal layer is the first metal layer is the metal line being closest to substrate 102 among all metal layers including metal lines extending in the first direction.

As shown in FIG. 2B, second level metal line 228 has a thickness $T_{metal\ line\ 228}$, which can be seen as $T_{1st\ metal\ line}$ in equation (5). In some embodiments, $T_{metal\ line\ 228}$ (i.e. $T_{1st\ metal\ line}$) is larger than or equal to the sum of 0.6 times $P_{gate\ 208ab}$ (i.e. $P_{gate\ min}$) and 0.45 times $L_{gate\ 208c}$ of gate structure 208c (i.e. $L_{gate\ min}$) and 0.15 times $H_{gate}$ of any one of gate structures 208a to 208c (i.e. $H_{gate\ min}$). That is, second level metal line 228 may be designed to follow equation (5) as previously described.

As shown in FIG. 2A, second level metal line 228 has a width W line 228, which can be seen as $W_{1st\ metal\ line}$ in semiconductor structure 100b. In some embodiments, $W_{metal\ line\ 228}$ of second level metal line 228 is larger than or equal to the sum of 0.38 times $P_{gate\ 208ab}$ (i.e. $P_{gate\ min}$) and 0.23 times $L_{gate\ 208c}$ of gate structure 208c (i.e. $L_{gate\ min}$) and 0.13 times $H_{gate}$ of any one of gate structures 208a to 208c (i.e. $H_{gate\ min}$). That is, second level metal line 228 may be designed to follow equation (6) described previously.

As shown in FIG. 2A, via 224 is connected to second metal line 228, and via 224 has a length $L_{via\ 224}$, which can be seen as $L_{via}$ in equation (7). In some embodiments, $L_{via\ 224}$ (i.e. $L_{via}$) is larger than or equal to the sum of 0.26 times $P_{gate\ 208ab}$ (i.e. $P_{gate\ min}$) and 0.11 times $L_{gate\ 208c}$ of gate structure 208c (i.e. $L_{gate\ min}$) and 0.12 times $H_{gate}$ of any one of gate structures 208a to 208c (i.e. $H_{gate\ min}$). That is, via 224 is designed to follow equation (7) described previously.

It should be noted that semiconductor structure 100b may further include various conductive features in various dielectric layers, such as various metal layers and via layers, and the scope of the disclosure is not intended to be limiting.

Figure 3:
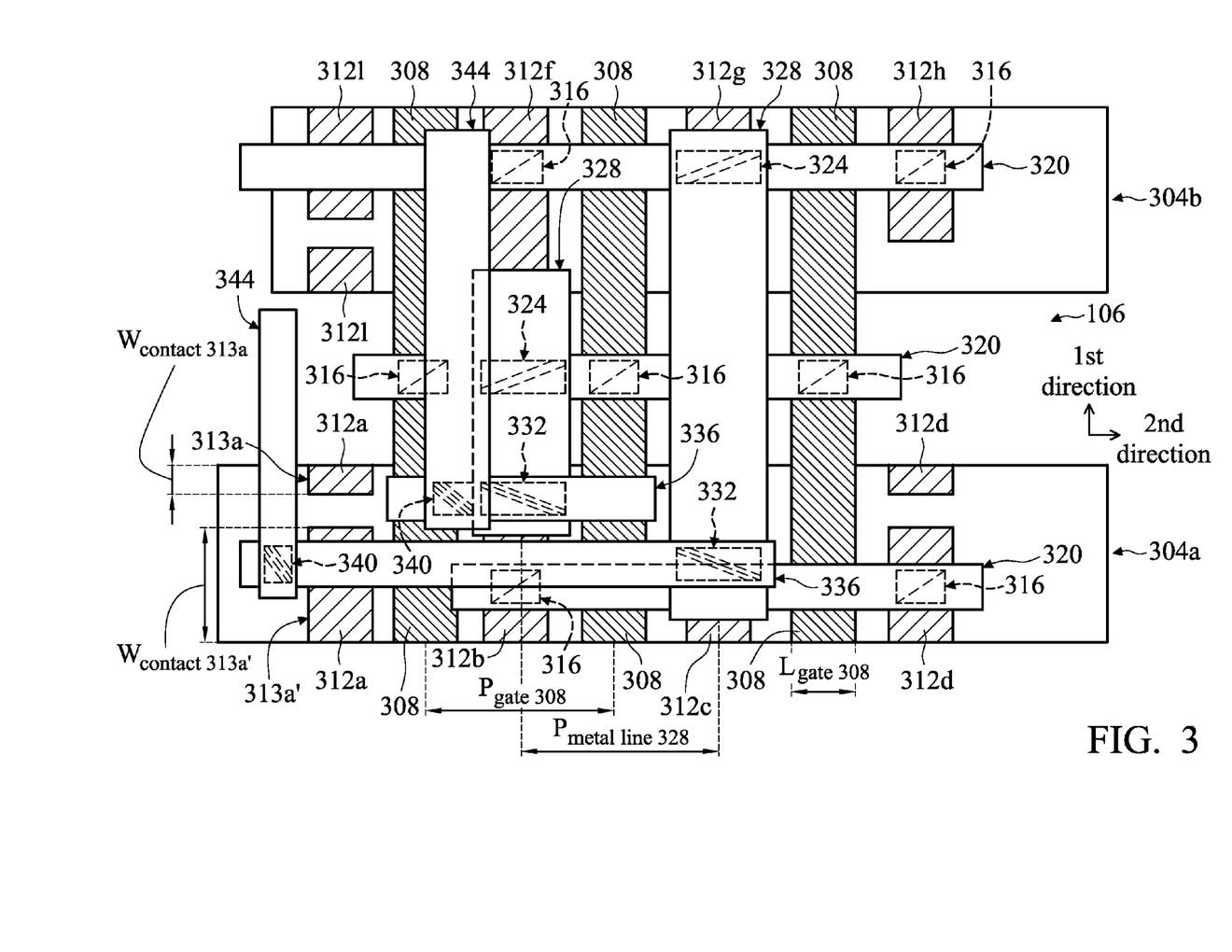
FIG. 3 is a top-view representation of a semiconductor structure in accordance with some embodiments.

FIG. 3 is a top-view representation of a semiconductor structure 100c in accordance with some embodiments. Similar to semiconductor structures 100a and 100b, semiconductor structure 100c also includes substrate 102 and isolation structure 106 formed in substrate 102. In addition, a first diffusion region 304a and a second diffusion region 304b are formed on opposite sides of isolation structure 106. First diffusion region 304a and second diffusion region 304b may be doped with different types of dopants. In some embodiments, first diffusion region 304a is a p-type diffusion region and second diffusion region 304b is an n-type diffusion region.

Materials and methods for forming first diffusion region 304a and second diffusion region 304b may be similar to, or the same as, those for forming diffusion region 104 shown in FIG. 1A and are not repeated herein.

Gate structures 308 are formed over substrate 102, and contacts 312a to 312h are formed adjacent to gate structures 308, as shown in FIG. 3 in accordance with some embodiments. As shown in FIG. 3, contacts 312a to 312h have various contact widths. In addition, contact 312a includes a first portion 313a and a second portion 313a', and contact width $W_{contact\ 312a}$ is defined as the sum of width $W_{contact\ 313a}$ of first portion 313a and width $W_{contact\ 313a'}$ of second portion 313a'. That is, contact width is defined as the sum of the widths of the contacts in the same line in the second direction (i.e. substantially parallel to the gate structures) in the same diffusion region.

In some embodiments, the sum of width $W_{contact\ 313a}$ and width $W_{contact\ 313a'}$ is larger than 1.4 times gate length $L_{gate\ 308}$ of gate structure 308 (i.e. $L_{gate\ min}$). That is, contact width $W_{contact\ 312a}$ in first diffusion region 104 in semiconductor structure 100c may be designed to follow equation (1) described previously.

Similar to semiconductor structures 100a and 100b, semiconductor structure 100c further includes an interconnect structure electrically connected with gate structures 308 and contacts 312a to 312f. As shown in FIG. 3, the interconnect structure includes first level vias 316, first level metal lines 320, second level vias 324, second level metal lines 328, third level vias 332, third level metal lines 336, fourth level vias 340, and fourth level metal lines 344 in accordance with some embodiments.

In addition, a first level via layer including first level vias 316 is formed over gate structures 308, and a first level metal layer including first level metal lines 320 is formed over the first level via layer. A second level via layer including second level vias 324 is formed over the first level metal layer, and a second level metal layer including second level metal lines 328 is formed over the second level via layer.

Next, a third level via layer including third level vias 332 is formed over the second level metal layer, and a third level metal layer including third level metal lines 336 is formed over the third level via layer. Afterwards, a forth level via layer including fourth level vias 340 is formed over the third level metal layer, and a fourth level metal layer including fourth level metal lines 344 is formed over the fourth level via layer. Materials and method used to form the metal lines and via shown in FIG. 3 may be similar to, or the same as, those used to form the metal lines and vias shown in FIGS. 1A to 1C, and therefore the details of them are not repeated herein.

Semiconductor structure 100c may follow at least one of the equations (1) to (7) described previously. The second level metal layer including second level metal lines 328 may be seen as the first metal layer in semiconductor structure 100c. In some embodiments, pitch $P_{metal\ line\ 328}$ is larger than or equal to the sum of 0.5 times $P_{gate\ min}$ (e.g. pitch $P_{gate\ 308}$ of gate structure 308) and 0.55 times $L_{gate\ min}$ (e.g. length $L_{gate\ 308}$ of gate structure 308) and 0.18 times $H_{gate\ min}$ (e.g. the minimum height among gate structures 308). That is, second level metal lines 328 in semiconductor structure 100c may be designed to follow equation (4) described previously in accordance with some embodiments.

Figure 4:
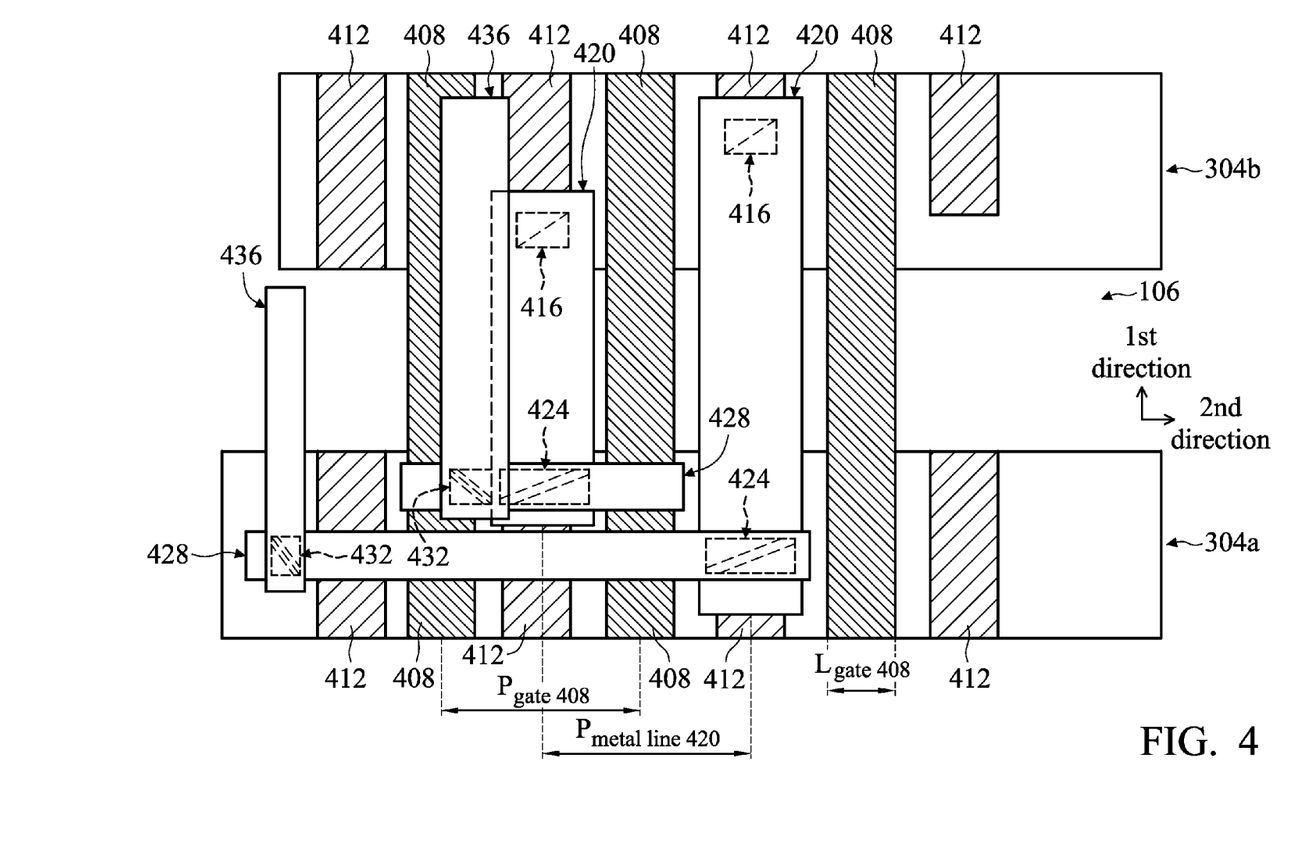
FIG. 4 is a top-view representation of a semiconductor structure in accordance with some embodiments.

FIG. 4 is a top-view representation of a semiconductor structure 100d in accordance with some embodiments. Similar to semiconductor structure 100c, semiconductor structure 100d also includes substrate 102, isolation structure 106, first diffusion region 304a, and second diffusion region 304b in accordance with some embodiments.

Gate structures 408 are formed over substrate 102, and contacts 412 are formed adjacent to gate structures 408, as shown in FIG. 4 in accordance with some embodiments.

Similar to semiconductor structures 100a to 100c, semiconductor structure 100d includes an interconnect structure electrically connected with gate structures 408 and contacts 412. As shown in FIG. 4, the interconnect structure includes first level vias 416, first level metal lines 420, second level vias 424, second level metal lines 428, third level vias 432, and third level metal lines 436 in accordance with some embodiments.

In addition, a first level via layer including first level vias 416 is formed over gate structures 408, and a first level metal layer including first level metal lines 420 is formed over the first level via layer. A second level via layer including second level vias 424 is formed over the first level metal layer, and a second level metal layer including second level metal lines 428 is formed over the second level via layer. Next, a third level via layer including third level vias 432 is formed over the second level metal layer, and a third level metal layer including third level metal lines 436 is formed over the third level via layer.

Materials and method used to form the gate structures, the contacts, the metal lines, and the via shown in FIG. 4 may be similar to, or the same as, those shown in FIGS. 1A to 1C and described previously, and therefore the details of them are not repeated herein.

Semiconductor structure 100d may follow at least one of the equations (1) to (7) described above. As shown in FIG. 4, the first metal layer having the metal lines extending in the first direction is the first metal layer including first level metal lines 420. Therefore, the first metal layer including first metal lines 420 may be seen as the first metal layer in semiconductor structure 100d. In some embodiments, pitch $P_{metal\ line\ 420}$ is larger than or equal to the sum of 0.5 times $P_{gate\ min}$ (e.g. pitch $P_{gate\ 408}$ of gate structure 408) and 0.55 times $L_{gate\ min}$ (e.g. length $L_{gate\ 408}$ of gate structure 408) and 0.18 times $H_{gate\ min}$ (e.g. the minimum height among gate structures 408). That is, first level metal lines 420 in semiconductor structure 100d may be designed to follow equation (4) described above.

It should be noted that, although the first metal layer in semiconductor structure 100a is referred to as second level metal layer 126, a first metal layer in other semiconductor structures may be referred to another metal layer, as long as the metal layer is the metal layer closest to the gate structures among all metal layers having metal lines extending in a direction substantially parallel to its gate structures (e.g. the first direction.) For example, the first metal layer in semiconductor structure 100d is referred to as the first level metal layer including first level metal lines 420, instead of the second level metal layer including second level metal lines 428.

In addition, it should be noted that the layout shown in FIG. 1A to FIG. 4 are merely examples, and the scope of the disclosure is not intended to be limited. For examples, metal layers and via layers may additionally or alternatively be formed in the semiconductor structures, such as semiconductor structures 100a to 100d, as long as they are designed to follow at least one of the equations (1) to (7).

Generally, one method to increase functional density in a device is to increase the density of the units formed in the device, such as to reduce the pitch of the gate structures or the metal lines. However, as the size of the device shrinks, the manufacturing processes become very complicated. For example, the manufacturing processes may include a great amount of alignment and lithography processes. In addition, it is found that even if the device has an interconnect structure with high metal line density, its performance may not necessary be improved.

Therefore, in some embodiments, a semiconductor structure (e.g. semiconductor structures 100a to 100d) is designed to follow at least one of the equations (1) to (7) described previously. For example, the metal lines (e.g. metal lines 120, 128, and 136) are designed according to the size and layout of the gate structure (e.g. gate structure 108). As a result, the performance of the semiconductor structure may be improved without forming complicated or high-density metal line structure. That is, fewer lithography processes and alignment processes are required. Therefore, the processes of forming the semiconductor structure may be simplified and the cost for forming it may be reduced.

Embodiments for forming a semiconductor structure are provided. The semiconductor structure includes gate structures and an metal lines formed over the gate structures. The layout and/or size of the metal lines is designed according to the layout and/or size of the gate structures, such that the semiconductor structure can have a better performance, such as a lower resistance and/or a higher capacitance.

In some embodiments, a semiconductor structure is provided. The semiconductor structure includes a plurality of gate structures extending in a first direction formed over a substrate and a contact formed adjacent to the gate structures over the substrate. The semiconductor structure further includes a plurality of metal layers formed over the gate structures. In addition, some of the metal layers include metal lines extending in the first direction, and some of the metal layers include metal lines extending in a second direction substantially perpendicular to the first direction. Furthermore, the gate structures follow the following equation:

$$\frac{0.2P_{gate\ min}+0.35L_{gate\ min}+0.3H_{gate\ min}-20}{0.2L_{gate\ min}+0.8H_{gate\ min}-5} \times$$

$$\frac{0.3L_{gate\ min}+0.3H_{gate\ min}+5}{38} \leq 0.32$$

$P_{gate\ min}$ is the minimum value among gate pitches of the gate structures. $L_{gate\ min}$ is the minimum value among gate lengths of the gate structures. $H_{gate\ min}$ is the minimum value among gate heights of the gate structures.

In some embodiments, a semiconductor structure is provided. The semiconductor structure includes a plurality of gate structures extending in a first direction formed over a substrate and a contact formed adjacent to the gate structures over the substrate. The semiconductor structure further includes a plurality of metal layers formed over the gate structures. The metal layers include a first metal layer including first metal lines extending in the first direction and a plurality of the first type metal layers including metal lines extending in the first direction formed over the first metal layer. The metal layers include a plurality of the second type metal layers including metal lines extending in a second direction substantially perpendicular to the first direction. In addition, the gate structures and the contact follow the following equation:

$$W_{contact} \geq 1.4L_{gate\ min};$$

and $$\frac{0.2P_{gate\ min}+0.35L_{gate\ min}+0.3H_{gate\ min}-20}{0.2L_{gate\ min}+0.8H_{gate\ min}-5} \times$$

$$\frac{0.3L_{gate\ min}+0.3H_{gate\ min}+5}{38} \leq 0.32$$

$W_{contact}$ is the contact width of the contact, and $P_{gate\ min}$ is the minimum value among gate pitches of the gate structures. $L_{gate\ min}$ is the minimum value among gate lengths of the gate structures, and $H_{gate\ min}$ is the minimum value among gate heights of the gate structures.

In some embodiments, a semiconductor structure is provided. The semiconductor structure includes a plurality of gate structures formed over a substrate and a contact formed adjacent to one of the gate structures over the substrate. The semiconductor structure further includes a plurality of metal layers formed over the gate structures. The metal layers include a first metal layer including first metal lines extending in a first direction substantially parallel to the gate structures and a plurality of first type metal layers including metal lines extending in the first direction. The metal layers include a plurality of second type metal layers including metal lines extending in a second direction substantially perpendicular to the first direction. In addition, a distance between the first metal layer and the substrate is smaller than a distance between any one of the first type metal layers and the substrate. Furthermore, pitches of the first metal lines follow the following equation:

$$P_{1st\ metal\ line\ min} \geq 0.5P_{gate\ min}+0.55L_{gate\ min}+0.18H_{gate\ min},$$

$P_{1st\ metal\ line\ min}$ is the minimum value among pitches of the first metal lines of the first metal layer, and $P_{gate\ min}$ is the minimum value among all gate pitches of the gate structures. $L_{gate\ min}$ is the minimum value among all gate lengths of the gate structures, and $H_{gate\ min}$ is the minimum value among all gate heights of the gate structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
   a plurality of gate structures extending in a first direction formed over a substrate;
   a contact formed adjacent to the gate structures over the substrate; and
   a plurality of metal layers formed over the gate structures, wherein some of the metal layers comprise metal lines extending in the first direction, and some of the metal layers comprise metal lines extending in a second direction substantially perpendicular to the first direction,
   wherein the gate structures follow the following equation:

$$\frac{0.2P_{gate\ min}+0.35L_{gate\ min}+0.3H_{gate\ min}-20}{0.2L_{gate\ min}+0.8H_{gate\ min}-5} \times$$

$$\frac{0.3L_{gate\ min}+0.3H_{gate\ min}+5}{38} \leq 0.32$$

wherein $P_{gate\ min}$ is the minimum value among gate pitches of the gate structures;
   $L_{gate\ min}$ is the minimum value among gate lengths of the gate structures; and
   $H_{gate\ min}$ is the minimum value among gate heights of the gate structures.

2. The semiconductor structure as claimed in claim 1, wherein the contact has a contact width $W_{contact}$ following the following equation:

$$W_{contact} \geq 1.4L_{gate\ min}.$$

3. The semiconductor structure as claimed in claim 2, wherein two metal line pitches $P_{metal\ line}$ of the metal lines in two of the metal layers follow the following equation:

$$P_{metal\ line} \leq 0.76 P_{gate\ min}.$$

4. The semiconductor structure as claimed in claim 2, wherein the metal layers further comprise a first metal layer having first metal lines extending in the first direction, and the first metal layer is the metal layer positioned closest to the gate structure among the metal layers which comprise metal lines extending in the first direction, and pitches of the first metal lines in the first metal layer follow the following equation:

$$P_{1st\ metal\ line\ min} \geq 0.5 P_{gate\ min} + 0.55 L_{gate\ min} + 0.18 H_{gate\ min}$$

wherein $P_{1st\ metal\ line\ min}$ is the minimum value among the pitches of the first metal lines in the first metal layer.

5. The semiconductor structure as claimed in claim 2, wherein the metal layers comprise a first metal layer having first metal lines extending in the first direction, and the first metal layer is the metal layer positioned closest to the gate structures among the metal layers which comprise metal lines extending in the first direction, and at least one of the first metal lines has a thickness $T_{1st\ metal\ line}$ following the following equation:

$$T_{1st\ metal\ line} \geq 0.6 P_{gate\ min} + 0.45 L_{gate\ min} + 0.15 H_{gate\ min}.$$

6. The semiconductor structure as claimed in claim 2, wherein the metal layers comprise a first metal layer having first metal lines extending in the first direction, and the first metal layer is the metal layer positioned closest to the gate structures among the metal layers which comprise metal lines extending in the first direction, and at least one of the first metal lines has a width $W_{1st\ metal\ line}$ following the following equation:

$$W_{1st\ metal\ line} \geq 0.38 P_{gate\ min} + 0.23 L_{gate\ min} + 0.13 H_{gate\ min}.$$

7. The semiconductor structure as claimed in claim 2, wherein the metal layers comprise a first metal layer having first metal lines extending in the first direction, and the first metal layer is the metal layer positioned closest to the gate structures among the metal layers which comprise metal lines extending in the first direction, and a via connecting to one of the first metal lines in the first metal layer has a via length $L_{via}$ following the following equation:

$$L_{via} \geq 0.26 P_{gate\ min} + 0.11 L_{gate\ min} + 0.12 H_{gate\ min}.$$

8. A semiconductor structure, comprising:
a plurality of gate structures extending in a first direction formed over a substrate;
a contact formed adjacent to the gate structures over the substrate; and
a plurality of metal layers formed over the gate structures, wherein the metal layers comprise:
  a first metal layer comprising first metal lines extending in the first direction;
  a plurality of first type metal layers comprising metal lines extending in the first direction formed over the first metal layer; and
  a plurality of second type metal layers comprising metal lines extending in a second direction particular to the first direction;
wherein the gate structures and the contact follow the following equation:

$$W_{contact} \geq 1.4 L_{gate\ min};\ and$$

$$\frac{0.2 P_{gate\ min} + 0.35 L_{gate\ min} + 0.3 H_{gate\ min} - 20}{0.2 L_{gate\ min} + 0.8 H_{gate\ min} - 5} \times \frac{0.3 L_{gate\ min} + 0.3 H_{gate\ min} + 5}{38} \leq 0.32$$

wherein $W_{contact}$ is a contact width of the contact;
$P_{gate\ min}$ is the minimum value among gate pitches of the gate structures;
$L_{gate\ min}$ is the minimum value among gate lengths of the gate structures; and
$H_{gate\ min}$ is the minimum value among gate heights of the gate structures.

9. The semiconductor structure as claimed in claim 8, wherein the contact has a first portion and a second portion, and the contact width $W_{contact}$ is defined as a sum of widths of the first portion and the second portion.

10. The semiconductor structure as claimed in claim 8, wherein at least two metal line pitches $P_{metal\ line}$ of the metal lines in the two of the metal layers follow the following equation:

$$P_{metal\ line} \leq 0.76 P_{gate\ min}.$$

11. The semiconductor structure as claimed in claim 10, wherein a pitch of one of the first metal lines follows the following equation:

$$P_{1st\ metal\ line\ min} \geq 0.5 P_{gate\ min} + 0.55 L_{gate\ min} + 0.18 H_{gate\ min},$$

wherein $P_{1st\ metal\ line\ min}$ is the minimum value among pitches of the first metal lines in the first metal layer.

12. The semiconductor structure as claimed in claim 11, wherein at least one of the first metal lines has a thickness $T_{1st\ metal\ line}$ following the following equation:

$$T_{1st\ metal\ line} \geq 0.6 P_{gate\ min} + 0.45 L_{gate\ min} + 0.15 H_{gate\ min}.$$

13. The semiconductor structure as claimed in claim 11, wherein at least one of the first metal lines has a width $W_{1st\ metal\ line}$ following the following equation:

$$W_{1st\ metal\ line} \geq 0.38 P_{gate\ min} + 0.23 L_{gate\ min} + 0.13 H_{gate\ min}.$$

14. The semiconductor structure as claimed in claim 11, further comprising:
a via connecting to one of the first metal lines, wherein the via has a via length $L_{via}$ following the following equation:

$$L_{via} \geq 0.26 P_{gate\ min} + 0.11 L_{gate\ min} + 0.12 H_{gate\ min}.$$

15. A semiconductor structure, comprising:
a plurality of gate structures formed over a substrate;
a contact formed adjacent to one of the gate structures over the substrate; and
a plurality of metal layers formed over the gate structures, wherein the metal layers comprise:
  a first metal layer comprising first metal lines extending in a first direction substantially parallel to the gate structures;
  a plurality of first type metal layers comprising metal lines extending in the first direction; and a plurality of second type metal layers comprising metal lines extending in a second direction substantially perpendicular to the first direction, wherein a distance between the first metal layer and the substrate is smaller than a distance between any one of the first type metal layers and the substrate, and pitches of the first metal lines follow the following equation:

$$P_{1st\ metal\ line\ min} \geq 0.5 P_{gate\ min} + 0.55 L_{gate\ min} + 0.18 H_{gate\ min},$$

wherein $P_{1st\ metal\ line\ min}$ is the minimum value among pitches of the first metal lines of the first metal layer;

$P_{gate\ min}$ is the minimum value among all gate pitches of the gate structures;

$L_{gate\ min}$ is the minimum value among all gate lengths of the gate structures; and $H_{gate\ min}$ is the minimum value among all gate heights of the gate structures.

16. The semiconductor structure as claimed in claim 15, wherein the contact has a contact width $W_{contact}$ following the following equation:

$$W_{contact} \geq 1.4 L_{gate\ min}.$$

17. The semiconductor structure as claimed in claim 15, wherein the gate structures follow the following equation:

$$\frac{0.2 P_{gate\ min} + 0.35 L_{gate\ min} + 0.3 H_{gate\ min} - 20}{0.2 L_{gate\ min} + 0.8 H_{gate\ min} - 5} \times$$

$$\frac{0.3 L_{gate\ min} + 0.3 H_{gate\ min} + 5}{38} \leq 0.32.$$

18. The semiconductor structure as claimed in claim 15, wherein at least two metal line pitches $P_{metal\ line}$ of the metal lines in two of the metal layers follow the following equation:

$$P_{metal\ line} \leq 0.76 P_{gate\ min}.$$

19. The semiconductor structure as claimed in claim 15, wherein at least one of the first metal lines follows at least one of the following equations:

$$T_{1st\ metal\ line} \geq 0.6 P_{gate\ min} + 0.45 L_{gate\ min} + 0.15 H_{gate\ min};$$

and $$W_{1st\ metal\ line} \geq 0.38 P_{gate\ min} + 0.23 L_{gate\ min} + 0.13 H_{gate\ min},$$

wherein $T_{1st\ metal\ line}$ is a thickness of one first metal line; and $W_{1st\ metal\ line}$ is a width of one first metal line.

20. The semiconductor structure as claimed in claim 15, further comprising:

a via connecting to one of the first metal lines, wherein the via has a via length $L_{via}$ following the following equation:

$$L_{via} \geq 0.26 P_{gate\ min} + 0.11 L_{gate\ min} + 0.12 H_{gate\ min}.$$

* * * * *